(12) United States Patent
Nicosia et al.

(10) Patent No.: US 6,356,505 B2
(45) Date of Patent: Mar. 12, 2002

(54) INTERNAL REGENERATION OF THE ADDRESS LATCH ENABLE (ALE) SIGNAL OF A PROTOCOL OF MANAGEMENT OF A BURST INTERLEAVED MEMORY AND RELATED CIRCUIT

(75) Inventors: Salvatore Nicosia, Palermo; Fabrizio Campanale, Bari; Francesco Tomaiuolo, Monte Sant' Angelo; Luca Giuseppe De Ambroggi, Catania; Luigi Pascucci, Sesto San Giovanni, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/773,283

(22) Filed: Jan. 31, 2001

(30) Foreign Application Priority Data

Jan. 31, 2000 (EP) .............................. 00830068
Mar. 3, 2000 (EP) .............................. 00200752

(51) Int. Cl.⁷ ............................................... G11C 8/18
(52) U.S. Cl. ............................ 365/230.09; 365/230.08; 365/230.04; 365/230.03; 365/233; 365/194
(58) Field of Search ................... 365/230.09, 230.08, 365/230.03, 230.04, 233, 233.5, 236, 194

(56) References Cited

U.S. PATENT DOCUMENTS 5,463,591 A * 10/1995 Aimoto et al. ......... 365/230.05
5,559,990 A    9/1996 Cheng et al. ................. 711/157
5,596,539 A    1/1997 Passow et al. ............... 365/210
5,696,917 A   12/1997 Mills et al. ..................... 711/1
5,703,822 A * 12/1997 Ikeda ........................... 365/221
5,966,724 A   10/1999 Ryan ........................... 711/105
6,192,004 B1 *  2/2001 Aikawa et al. ............. 365/233
6,195,309 B1 *  2/2001 Ematrudo ................... 365/236

FOREIGN PATENT DOCUMENTS

| EP | 0561370 | 9/1993 | ............ G11C/7/00 |
| EP | 0961283 | 12/1999 | ............ G11C/7/00 |
| EP | 1 017 059 A1 * | 7/2000 | ............ G11C/7/00 |

* cited by examiner

Primary Examiner—Andrew Q. Tran
(74) Attorney, Agent, or Firm—Lisa K. Jorgenson; Allen, Dyer, Doppelt, Milbrath & Gilchrist, P.A.

(57) ABSTRACT

An interleaved memory is readable in a sequential access synchronous mode and in a random access asynchronous mode based upon externally generated command signals including an address latch enabling signal and a chip enable signal. The memory includes a circuit for regenerating the externally generated address latch enabling signal. A first and a second internal replica signal are generated by the circuit. The second internal replica signal has a leading edge that is delayed with respect to a leading edge of the first internal replica signal. A duration of the second internal replica signal is conditionally incremented to prevent non-synchronization between the externally generated address latch enabling signal and the externally generated chip enable signal when the interleaved memory is operating in the sequential access synchronous mode or in the random access asynchronous mode.

30 Claims, 5 Drawing Sheets

ALE: Blocks schematic

INTERNAL REGENERATION OF THE ADDRESS LATCH ENABLE (ALE) SIGNAL OF A PROTOCOL OF MANAGEMENT OF A BURST INTERLEAVED MEMORY AND RELATED CIRCUIT

FIELD OF THE INVENTION

The present invention relates in general to memory devices, and in particular, to an interleaved memory readable in a synchronous mode or in a random access asynchronous mode. The interleaved memory is read in the synchronous mode by successive locations with a sequential type of access, commonly referred to as a burst mode.

BACKGROUND OF THE INVENTION

In a standard memory a read cycle is defined from a request of data effected by the input of a new address, to the final output of the bits stored in the addressed location (byte, word, etc.). Internally, the reading process evolves through several steps. These steps start from the acquisition of the new address, to its decoding, to the generation of synchronizing pulses of the sensing circuits, and to the output of the read data.

The ATD (Address Transition Detection) signal recognizes a change of the address input by the external circuitry, and therefore, the new request of access and initiates a new read cycle. After enabling the sense amplifiers by the signal SAenable, an equalization of the sensing circuitry takes place. At the end of which, as timed by the signal EQZ, the effective reading of the memory cells takes place. Finally, after a certain interval of time that may vary from device to device, by way of a signal SAlatch, the recording of the read data into the latches in cascade to the sense amplifiers takes place, from where the read word may be transferred to the output buffers.

In memory devices designed for a synchronous read mode with a sequential type (burst) of access, the reading process exploits the fact that the reading takes place by successive locations. That is, the subsequent memory location to be read, and therefore, its address, is predictable from the address of the location being currently read.

A subgroup of these sequential (burst) synchronous read mode memories is represented by the interleaved memories. A burst access interleaved memory is described in U.S. Pat. No. 5,559,990, for example. In this type of memory, the cell array is divided in two semi-arrays or banks, each having its own read circuitry. The read streams of the two banks are thereafter superimposed according to one of the most commonly followed approaches, are outphased (i.e., out of phase) from each other. While on one of the two banks or semi-array the steps of evaluation and transfer of the data to the output are being performed, on the other bank or semi-array (the next location to be addressed) a new read cycle may be started without waiting for the conclusion of the current read cycle that involves the first semi-array.

In interleaved memories, a basic scheme of which is depicted in FIG. 1, the array is divided into two independent banks or semi-arrays, EVEN and ODD, respectively, each having its own independent read path. Typically, there are two counters (one for each bank) containing the address of the currently pointed memory location. In case of simultaneous reading processes evolving respectively on the two semi-arrays, the least significant bit of the address (A0) supports the multiplexing between the EVEN and the ODD banks. If A0=0, the data coming from the EVEN semi-array will be made available at the output. If A0=1, the data coming from the ODD semi-array will be made available at the output.

As it is commonly known, the reading of the two semi-arrays is carried out according to one of two different approaches. A first approach is simultaneous readings and multiplexing of the outputs. A second approach involves time readings that are out of phase.

According to the first approach, the readings are simultaneous on the two banks. The data read are stored in respective output registers and made available to the outside world in synchronization with an external clock signal. According to the second approach, the readings on the two semi-arrays have an alternate and interleaved evolution over time.

The first approach, though offering a simpler hardware implementation, limits the minimization of the start times of synchronous read cycles. For a better comprehension, it is necessary to consider the basic steps that are performed when passing from an asynchronous read mode to a synchronous read mode.

With reference to the scheme of FIG. 2, and starting the reading from an address X, the latter will be loaded on the EVEN bank counter and on the ODD bank counter, less the least significant bit (A0) of the address. The two counters will point to the same location X of the respective bank or semi-array.

If A0=0: the first read data is relative to the address X of the bank EVEN and the successive read data is the data X of the bank ODD.

If A0=1: the first read data is relative to the address X of the bank ODD and the successively read data is relative to the X+1 address of the bank EVEN.

In the first case, it is sufficient to perform a simultaneous reading of the two banks and multiplex the outputs. In the second instance, it is necessary to increment the counter before starting the reading on the bank EVEN.

Usually, known synchronous memory devices do not make any initial increment and wait for the successive cycle for incrementing both counters, and therefore, read the location X+1 of the banks EVEN and ODD. This makes the times of the first read cycle and of the second sequential read cycle at best equal to the asynchronous read mode time of the memory.

In general, it may be stated that the efficient management of the read processes has a direct influence of the performance of the memory device. Many read-path architectures have been proposed. Known read-path architectures have generally been conceived for responding efficiently to either one or the other of the two modes of operation: asynchronous or synchronous.

If a memory device is designed to be read in asynchronous mode, it will be generally provided with a rather simple control circuitry for the read data streams. This allows the use of adaptive structures, such as dummy wordlines and dummy sense amplifiers, while leaving the reading circuitry free to evolve as fast as possible in order to achieve the shortest asynchronous access delays.

In contrast, in memory devices designed to function in a burst access mode or in a synchronous read mode, the possibility of making available in output a certain number of words read and stored in advance, permits, after a first asynchronous access, as long as it may be, a series of extremely fast read cycles. In this case though, the control logic must intervene extensively to manage the sense amplifiers which should not be left to evolve freely but be enabled, equalized and read at precise instants established by the control system. Prior European Patent Application Serial No. EP-98830801, filed on Dec. 30, 1998, and Italian Patent Application Serial No. MI99A00248, filed on Nov. 26, 1999, describe burst-mode EPROM devices with the above characteristics. These patent applications are both incorporated herein by reference in their entirety, and are assigned to the assignee of the present invention.

According to prior European Patent Application No. 00830068.3, filed on Jan. 31, 2000, which is also incorporated herein by reference in its entirety, and is assigned to the assignee of the present invention, the requested access mode in reading the stored data is determined by a specified protocol of use of two of the commonly used external commands. These external commands are the address latch enabling signal ALE and the read stimulation signal RD.

The counters of the two semi-arrays, or the counter of the first bank and a more simpler register which functions as an address counter for the second bank, are incremented distinctly from one another. This is differently from what is commonly done in interleaved memory devices. The readings are thus out of phase on the two banks from the first (asynchronous) read cycle. In this way, the memory device is able to switch to a synchronous mode reading phase at any time, which practically cuts in half the access time to such a mode.

The two different reading processes, according to an asynchronous random access mode and according to a synchronous burst access mode, remain perfectly congruent with each other and have an alternate and interleaved evolution in time. The architecture described in the above referenced European Patent Application No. 00830068.3 provides for optimal performances. The performance is not compromised by the bivalent character of the device. This is whether commanded to function as a standard asynchronous random access memory or as a synchronous burst access memory.

The control circuit of the memory recognizes the type of access and reading mode that is required by way of a specific protocol of use of two external commands, namely the ALE and RD signals. The start of a standard read cycle (asynchronous mode) takes place as customary when the ALE signal assumes a high logic level 1. Upon the switching to a logic 1 of the ALE signal, the memory acquires (in its input latches) the desired address and simultaneously starts up the sense circuitry of both banks.

Of course, a first cycle will always be asynchronous and the independent arrays of sense amplifiers of the two banks are simultaneously activated. If the ALE signal does not return to its rest condition, that is to a logic 0 state, the two banks of sense amplifiers will complete their respective readings, each evolving according to its own self-adapting circuits. This is the same manner as in a standard asynchronous memory.

At the end of these readings, only the bank currently in a condition of priority, determined by the value of the least significant bit of the address, will be enabled to place the read data on an internal data bus. When ADD<0>=0, this establishes the priority of the EVEN bank, and when ADD<0>=1, this establishes the priority of the ODD bank.

Under these conditions, the reading stimulation signal RD behaves as an active low Output Enable command, such that when at a logic 0 level, the data of the bank currently in priority is transferred to the output buffers, and therefore, made available to the external world.

If the ALE signal switches back to a logic 0 level during the very first read cycle or thereafter during the n asynchronous random access read cycle, the control circuit interprets such an occurrence as a request for a change to a burst mode of access and to a synchronous read mode of the memory. In such a case, the control circuit generates a first increment pulse for the address counter (or optionally for the functionally equivalent register) of the bank which currently is not in priority.

In so doing, the reading of the data on the bank currently in priority is left to evolve, considering that this bank will be the first to be called to provide its data to the output of the memory, Simultaneously, the incremented address for the successive reading to be done on the other bank is prearranged (start of the synchronous burst interleaved reading mode).

The same increment pulse for the address counter (or register) of the bank currently not in priority stimulates also the respective reading circuitry of the bank. A specially modified ATD generator generates upon stimulation by the address counter incrementing pulse, a dummy ATD pulse that is due to internal stimulation and which is exclusively conveyed to the bank not in priority and to its decoding and sensing circuits.

In this way, the array of sense amplifiers of the bank not in priority, the relative sense control circuit and equalization dummy structures, etc., will interpret the address counter incrementing pulse as a normal asynchronous read cycle request and will restart. This is while the sense amplifiers of the bank currently in priority, being completely independent from those of the other bank, will continue to evolve in their reading process.

The control circuit of the memory will continue to monitor the signals coming from the sense control of the bank in priority. As soon as the sense control circuit provides the SAlatch signal for transferring the read data to the latches immediately in cascade of the respective sense amplifiers, the control circuit will generate a pulse commanding the loading of data on the output, i.e., a LOAD pulse. In this way, the functioning enters in a burst interleaved access mode.

The end of the LOAD pulse establishes the availability of the bank that has just terminated a read cycle to start a new read cycle. Therefore, a new address counter incrementing signal will be generated only for the counter (or equivalent register) of such a bank, which beside stimulating the generation of a sequentially updated internal address, will cause the generation of a new ATD pulse by internal stimulation (dummy). This is exclusively conveyed to the circuitry of such a bank.

These succession of address counter incrementing pulses have also the function of commuting the priority between the two banks in an alternate manner. In fact, because the first bank has terminated a read cycle and is about to start a new one, the bank that was not in priority and that in the meanwhile had restarted on its up-dated address, assumes priority.

Therefore, the control circuit of the memory will again wait for information coming from the asynchronous and self-adapting structures of sense control of such a bank as well as for an authorization by the external command RD to output the data of such a bank by the generation of a new LOAD pulse. From hereon, the steps described above may repeat indefinitely, alternating the sequence.

According to a preferred embodiment, the circuit that detects transitions in the latches acquiring the externally requested addresses generates a detection signal ATD even upon a switching of the outputs. This is during a phase of reentering from a state of standby with the external command ALE=0, and beside the acquisition of a new address from outside during a phase of random access or upon the incrementing of one the other address counters of the two banks during a phase of sequential access. This provides for a useful resume&recovery functionality, such as for producing in output the last read data before entering the phase of standby, or the data relative to the sequentially successive address. This depends on the logic state of the RD command at the moment of interrupting the sequential reading and entering in a phase of standby of the memory.

On another side, in complex systems, the ALE signal is often shared by several devices of the system, and therefore, it is filtered by a second fundamental control signal of the protocol, such as the chip enable signal CEn, specific for the particular device.

At high operating frequencies, the intrinsic delays that are introduced by the propagation lines of the signals cannot easily be predicted and controlled. This may create problems due to the possible non-synchronization between the two signals which must be avoided to correctly discriminate the ALE pulses intended for the memory device from those intended to other devices of the system.

Moreover, the synchronous mode of operation may often contemplate the possibility of resuming the sequential readings at the end of a standby period from the point in which the sequence of readings had been interrupted (Recovery & Resume). However, if in passing from the active phase to the standby phase, the ALE pulse anticipates the switching of the chip enable signal CEn, as illustrated in FIG. 2b. An incorrect capture of external addresses could occur with a consequent loss of the internal address autonomously calculated by the address counters of the two banks.

During the standby phase, the external ALE signal must be filtered, while upon reentering from standby and applying an external ALE pulse. The capture of the new address must take place with utmost speed in order not to lengthen the time. Usually, there is an ample combination of instances contemplated by the protocol that may make difficult interpreting the ALE signal. For example, if at high frequency, an ALE pulse of reduced duration is sliced by the CEn signal (1 to 0), there will be a consequent reduction of its effective duration, as depicted in FIG. 2a. This may not permit the new address to be to acquired correctly.

To ensure a correct functioning of the memory device under any condition, even at particularly high frequencies, the use of a conventional input buffer that reproduces faithfully the external ALE signal may not be sufficiently reliable.

SUMMARY OF THE INVENTION

In view of the foregoing background, the present invention provides a circuit that generates an internal replica of the Address Latch Enable signal having a duration that ensures the correct functioning of the memory under any situation contemplated by the protocol or command signals and to render the memory tolerant toward accidental misalignments among externally applied protocol signals.

The invention relies on a logic processing of the external protocol signal and on the introduction of appropriate delays which, by taking into account the propagation delays of the carry of the address counters that store the addresses of the locations in the two semi-arrays of an interleaved memory pointed during each read cycle, eliminates every criticality that may be due to possible time-base deformations. The externally applied signals are out of phase, and this ensures a certain minimum duration of the internally regenerated address latch enabling pulse for capturing the addresses being applied from external the memory.

An interleaved memory, readable in a sequential access synchronous mode and in a random access asynchronous mode based upon externally generated command signals including an address latch enabling signal and a chip enable signal, includes a circuit for regenerating the externally generated address latch enabling signal. The circuit preferably includes at least one latch for storing the externally generated address latch enabling signal and for providing an output signal, and at least one logic gate having inputs for receiving the output signal and the externally generated chip enable signal for providing a first internal replica signal of the externally generated address latch enabling signal.

An input pad preferably receives the externally generated chip enable signal, and delay circuits coupled in cascade to an output of the at least one latch and to the input pad provides a delayed output signal. A logic circuit preferably combines the first internal replica signal and the output signal with the delayed output signal for producing set and reset signals, and an output flip-flop circuit having inputs for receiving the set and reset signals for providing a second internal replica signal of the externally generated address latch enabling signal.

The second internal replica signal preferably has a leading edge that is delayed with respect to a leading edge of the first internal replica signal. A duration of the second internal replica signal is preferably conditionally incremented to prevent non-synchronization between the externally generated address latch enabling signal and the externally generated chip enable signal when the interleaved memory is operating in the sequential access synchronous mode or in the random access asynchronous mode.

DETAILED DESCRIPTION OF THE PREFERRED EMBODIMENTS

Figure 3:
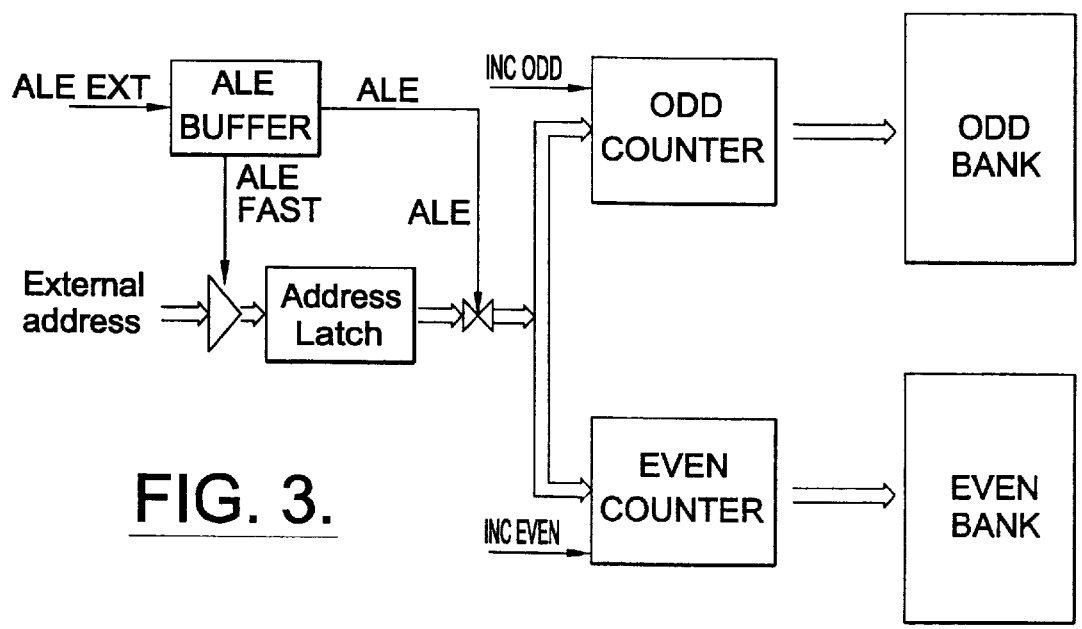
FIG. 3 is a basic block diagram of a preferred embodiment of a circuit for the internal regeneration of the external command signal ALE according to the present invention.

In order to illustrate in an effective manner the peculiarities of the technical approach of the present invention, it is useful to observe the elementary scheme of the input signal paths of the memory, as best illustrated in FIG. 3.

The signals output by the circuit are two, namely: ALE_FAST and ALE. The first of the two signals, ALE_FAST, controls the acquisition of the external address in the input latches in cascade of the input buffers. The second signal, ALE, controls and validates the acquisition of the address contained in the internal latches toward the counters EVEN COUNTER and ODD COUNTER of the respective banks. The output of the counters point directly to the memory locations and each time they are updated, a new reading cycle starts.

Figure 4:
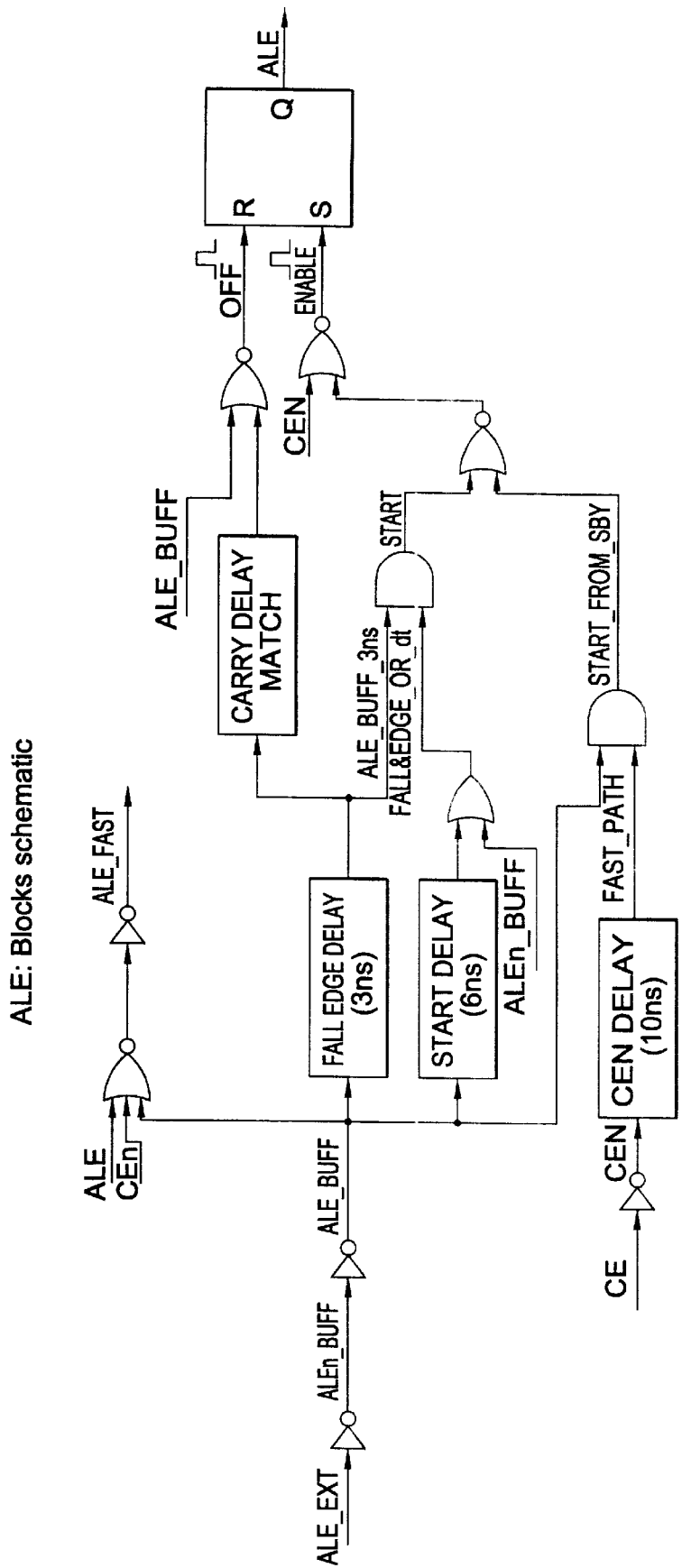
FIG. 4 is a basic block diagram of a circuit for implementing the timing diagram of FIG. 3.

The circuit structure of the invention is depicted in FIG. 4. The input latch of the external command, referred to as ALE_EXT, introduces a certain hysteresis. The network that generates the replica signal ALE_FAST is designed to produce it straightaway, and without any appreciable delay.

The circuit structures (START_DELAY and relative logic) that control the setting of the SR latch, permit validation of the acquisition of the external address in a definitive manner at the end of a filtering action to prevent false updating of the external address.

The structure CEn_DELAY permits suspending of the filtering action by the external command CEn upon reentering from a standby phase (start_from_sby=1). The structure 3ns_DELAY limits the filtering action if the external ALE pulse is excessively narrow by permitting an immediate updating of the counters with a fair margin. The structure CARRY_DELAY_MATCH permits construction of an internal pulse of minimum duration equal to the maximum time of propagation of the carry bit in the counters (ensuring a correct propagation of the first carry).

Figure 5:
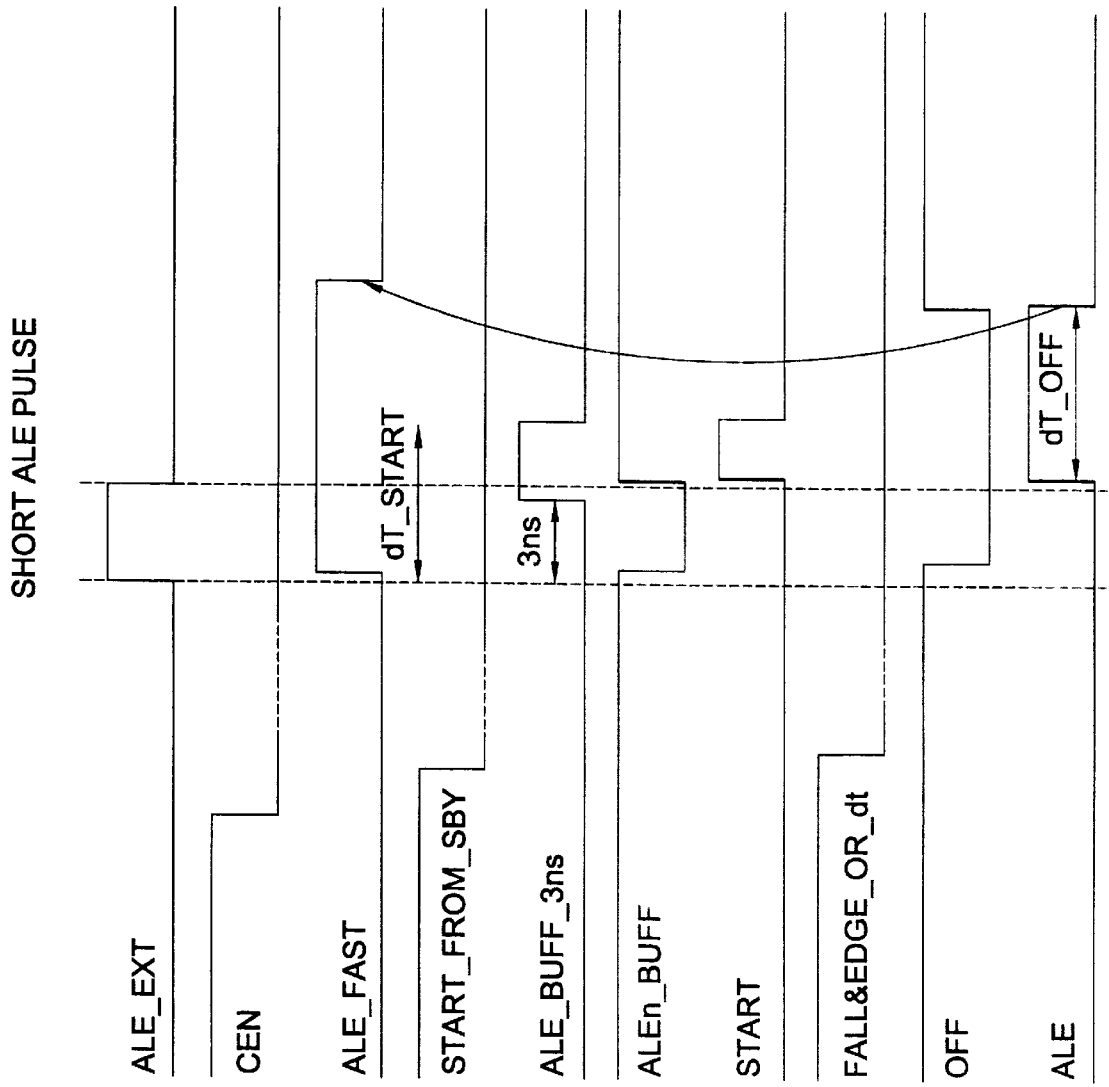
FIGS. 5, 6 and 7 are timing diagrams showing the behavior of the circuit of FIG. 4 under different operating conditions of the memory device.
Figure 6:
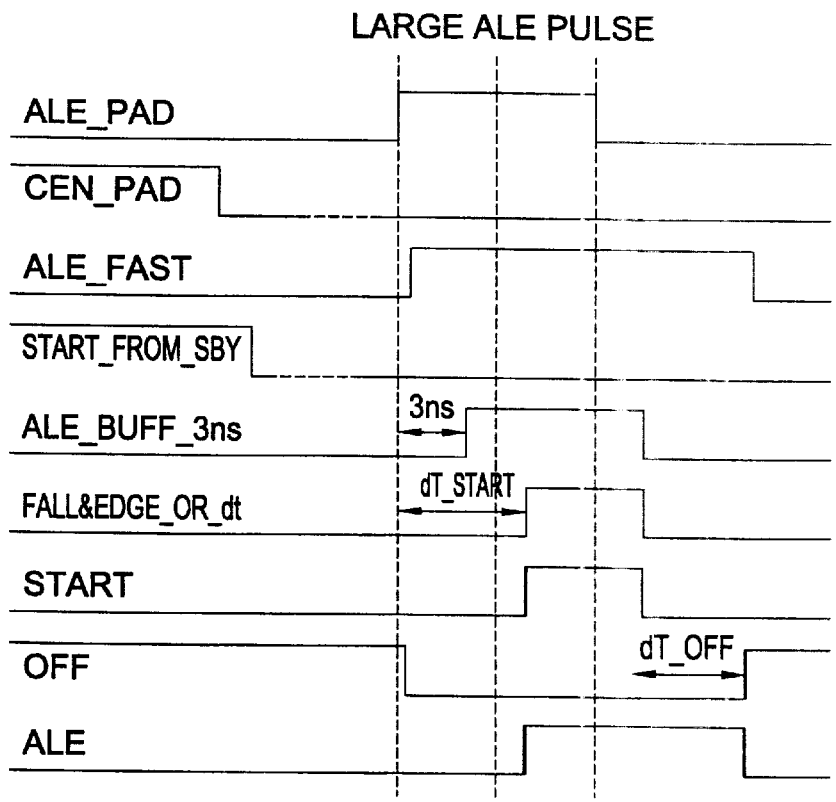
Figure 7:
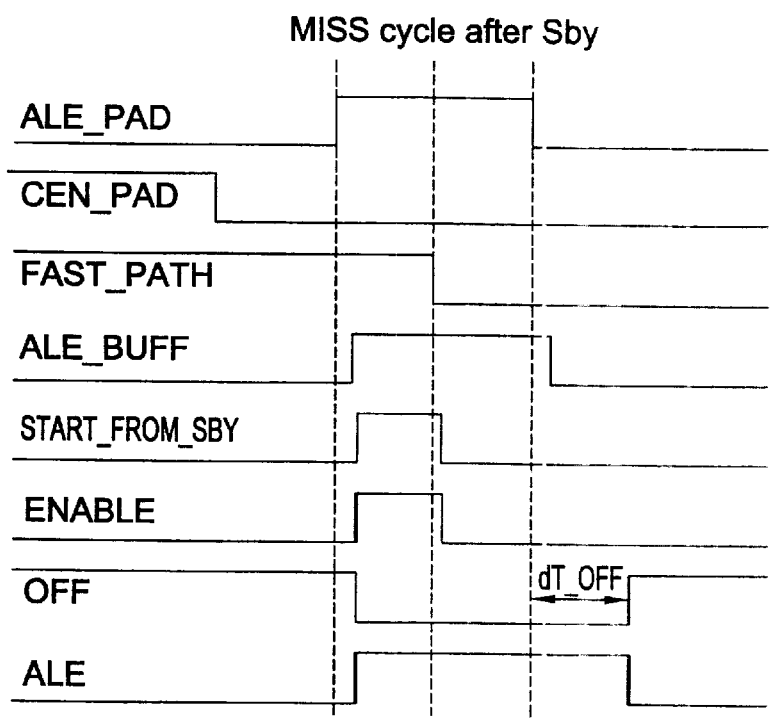

In the circuit of the invention, three distinct paths leading to the enabling of an internal replica of the ALE signal are present. They are alternatively enabled as a function of the state of an asynchronous state machine. In particular, four distinct situations may be defined:

a) narrow external ALE pulse, during an active phase (CEn=0) as depicted in FIG. 5;

b) broad external ALE pulse, during an active phase (CEn=0), as depicted in FIG. 6;

c) passage from an active phase to a standby phase; and d) resuming from a phase of standby with slicing of the external ALE pulse, as depicted in FIG. 7.

In the above noted four situations, the circuit generates in completely different manners the two internal replica signals: ALE_FAST and ALE. The communication protocol contemplates that if the memory is in a synchronous mode of operation, the existing output data should not absolutely be corrupted unless the user intentionally wants it.

Such a condition rests on the falling edge of the external ALE circuit or in the fact that after a certain time the CEn signal has not yet switched from a logic 0 to a 1. Therefore, it is necessary to delay the internal propagation of the ALE signal as long as and not beyond the falling edge of the externally applied ALE signal (case A, FIG. 5), or wait a certain time before producing the internal replica pulse (case B, FIG. 6).

The evolution of the internal signals of the circuit of FIG. 4 is illustrated in FIGS. 5 and 6. In case A, as illustrated in FIG. 5, the start of an internal ALE pulse is stimulated by the falling edge of the external signal ALE_EXT.

In the case B, as illustrated in FIG. 6, a specified time interval (dt_START) elapses before stimulating the generation of the internal ALE replica pulse. This analog delay may be realized by using a reference voltage source provided with a suitable stabilizing network. This is to make the delay as much as possible stable upon the varying of the supply voltage, of temperature and in relation to the fabrication process spread.

In fact, in normal operation conditions, the delay introduced in generating the internal replica of the external ALE command determines an expansion of the read time of the memory. This effect of expansion of the read time is reduced thanks to the immediate generation of the other internal replica signal ALE_FAST that immediately enables the input circuits, thus reducing the overall propagation time. In all situations, the ALE_FAST signal is immediately issued upon sensing the rising edge of an external ALE pulse.

Figure 1:
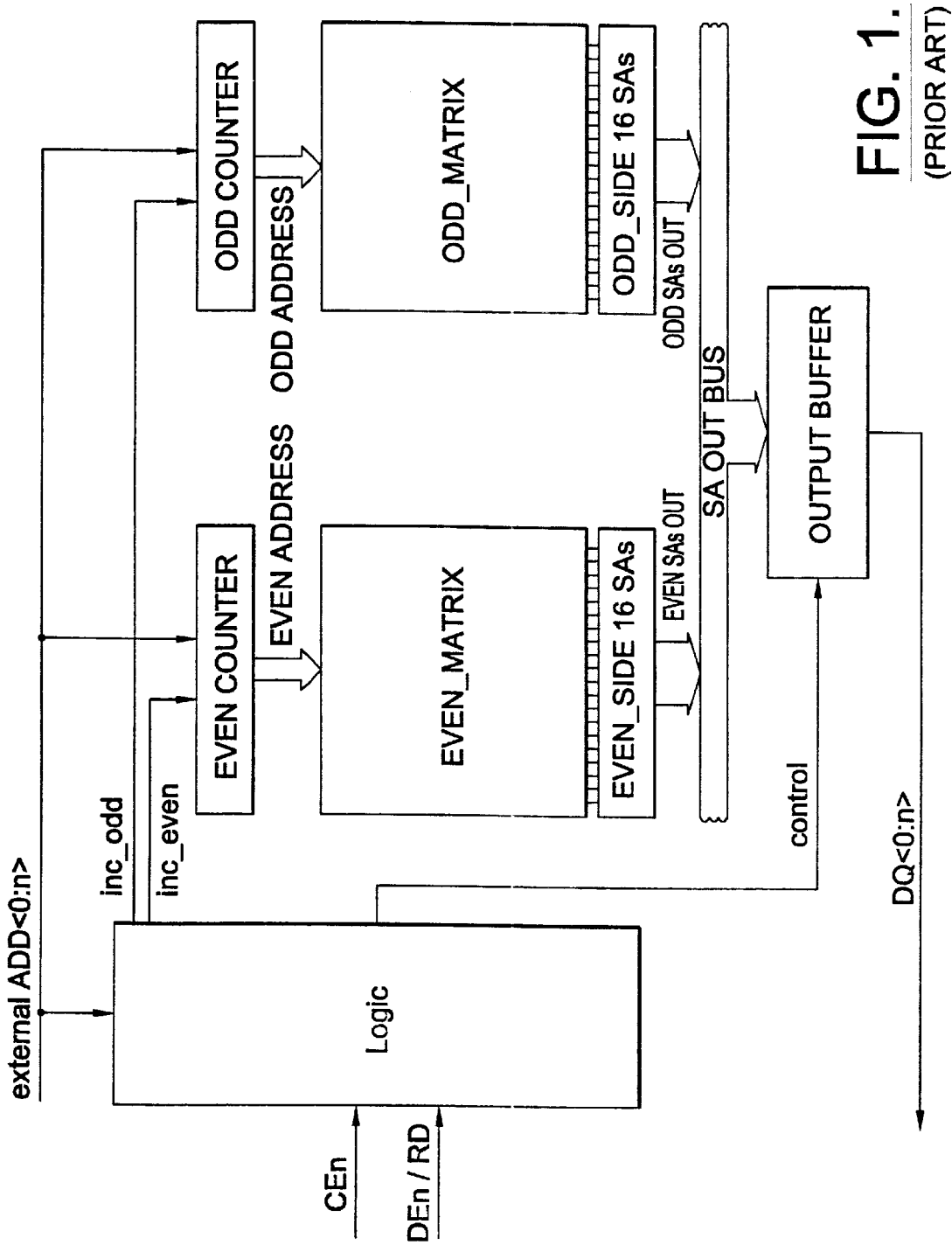
FIG. 1 is a basic block diagram of an interleaved memory according to the prior art.
Figure 2A:
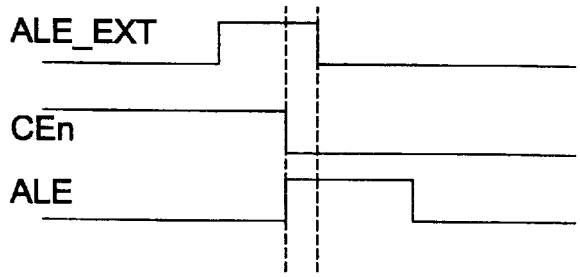
FIG. 2 is a timing diagram showing the criticality that may arise due to a possible non-synchronization between the two external command signals ALE and CEn according to the prior art.
Figure 2B:
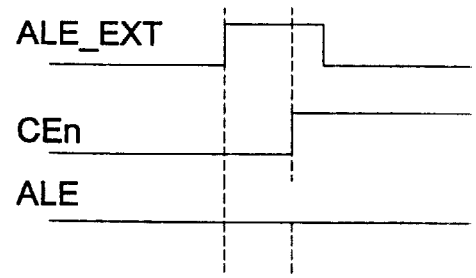

In the case C, as illustrated in FIG. 2b, the internal ALE pulse is not generated because the switching CEn signal (0 to 1) keeps the memory device in a standby condition and inhibits the set of the output latch of the circuit of FIG. 4.

In the case D, the memory is in a phase of resuming operation at the end of a standby period, and therefore, it is necessary to generate as fast as possible both internal replicas of the external ALE_EXT pulse, that is both the ALE and the ALE_FAST pulses. In this case, by exploiting the delay CEn_DELAY, the asynchronous state machine recognizes this situation and enables the fastest circuit path that sets the issuing of the internal pulses, as depicted in FIG. 7.

Substantially, the circuit of the invention implements and uses different possible circuit paths (relatively slow and fast paths) for issuing the internally generated replica pulses, thus satisfying contrasting requisites.

Another function of the circuit is to control the width of the ALE pulse. This is particularly important when starting a phase of synchronous mode of operation of the memory. The internally generated ALE pulse, beside incrementing the address in the counters, starts in coincidence with its falling edge, the subsequent synchronous phase of operation of the memory. In this phase, it is necessary to increment the address counter of the bank on which the next reading must take place.

In particular, by introducing an external address pointing to the ODD bank (A0=1), it is necessary to increment the counter of the EVEN bank before effecting the successive synchronous read cycle. The internally produced ALE pulse must be such to allow for the capture of the updated address by the counter of the EVEN bank and permit the propagation of the carry of the counter to make it ready for a subsequent increment.

By observing the block diagram of FIG. 4, it may easily understood the purpose of the 3 ns delay coupled to the CARRY_DELAY_MATCH in determining the width of the pulse and controlling the OFF node. The delay may be compared with the delay of the carry in the address counter and is enabled starting from the falling edge of the external ALE pulse. This ensures a certain minimum duration of the internally regenerated ALE pulses.

Optionally, the circuit may further include forcing devices useful in test modes or during the execution of internal algorithms; anti-noise protections activated during the transitions of the outputs; and trimming devices of the analog delays, implemented in metal 1. Of course, the delay network used, besides being precise, must ensure a constancy of the introduced delay with the varying of the conditions of operation such as temperature and supply voltage.

That which is claimed is:

1. An interleaved memory readable in a sequential access synchronous mode and in a random access asynchronous mode based upon externally generated command signals including an address latch enabling signal and a chip enable signal, the interleaved memory comprising:

a circuit for regenerating the externally generated address latch enabling signal comprising at least one latch for storing the externally generated address latch enabling signal and for providing an output signal, at least one logic gate having inputs for receiving the output signal and the externally generated chip enable signal for providing a first internal replica signal of the externally generated address latch enabling signal, an input pad for receiving the externally generated chip enable signal, delay circuits coupled in cascade to an output of said at least one latch and to the input pad for providing a delayed output signal, at least one logic circuit for combining the first internal replica signal and the output signal with the delayed output signal for producing set and reset signals, and an output flip-flop circuit having inputs for receiving the set and reset signals and an output for producing a second internal replica signal of the externally generated address latch enabling signal.

2. An interleaved memory according to claim 1, wherein the second internal replica signal has a leading edge that is delayed with respect to a leading edge of the first internal replica signal.

3. An interleaved memory according to claim 1, wherein a duration of the second internal replica signal is conditionally incremented to prevent non-synchronization between the externally generated address latch enabling signal and the externally generated chip enable signal when the interleaved memory is operating in the sequential access synchronous mode or in the random access asynchronous mode.

4. An interleaved memory according to claim 1, wherein said at least one logic gate comprises a NOR logic gate.

5. An interleaved memory according to claim 1, wherein said delay circuits provide a plurality of distinct paths for varying a delay of the delayed output signal.

6. An interleaved memory according to claim 5, wherein the plurality of paths comprises three.

7. An interleaved memory comprising:
a circuit for regenerating an externally generated address latch enabling signal comprising
at least one latch for storing the externally generated address latch enabling signal and for providing an output signal,
at least one logic gate having inputs for receiving the output signal and an externally generated chip enable signal for providing a first internal replica signal of the externally generated address latch enabling signal,
delay circuits coupled in cascade to an output of said at least one latch for providing a delayed output signal,
at least one logic circuit for combining the first internal replica signal and the output signal with the delayed output signal for producing set and reset signals, and
an output flip-flop circuit having inputs for receiving the set and reset signals and an output for producing a second internal replica signal of the externally generated address latch enabling signal.

8. An interleaved memory according to claim 7, wherein the interleaved memory is readable in a sequential access synchronous mode and in a random access asynchronous mode.

9. An interleaved memory according to claim 7, further comprising an input pad for receiving the externally generated chip enable signal; and wherein said delay circuits are coupled to the input pad.

10. An interleaved memory according to claim 7, wherein the second internal replica signal has a leading edge that is delayed with respect to a leading edge of the first internal replica signal.

11. An interleaved memory according to claim 7, wherein a duration of the second internal replica signal is conditionally incremented to prevent non-synchronization between the externally generated address latch enabling signal and the externally generated chip enable signal when the interleaved memory is operating in a sequential access synchronous mode or in a random access asynchronous mode.

12. An interleaved memory according to claim 7, wherein said at least one logic gate comprises a NOR logic gate.

13. An interleaved memory according to claim 7, wherein said delay circuits provide a plurality of distinct paths for varying a delay of the delayed output signal.

14. An interleaved memory according to claim 13, wherein the plurality of paths comprises three.

15. A circuit for regenerating an externally generated address latch enabling signal for an interleaved memory, the circuit comprising:
at least one latch for storing the externally generated address latch enabling signal and for providing an output signal;
at least one logic gate having inputs for receiving the output signal and an externally generated chip enable signal for providing a first internal replica signal of the externally generated address latch enabling signal;
delay circuits coupled in cascade to an output of said at least one latch for providing a delayed output signal;
at least one logic circuit for combining the first internal replica signal and the output signal with the delayed output signal for producing set and reset signals; and
an output flip-flop circuit having inputs for receiving the set and reset signals and an output for producing a second internal replica signal of the externally generated address latch enabling signal.

16. A circuit according to claim 15, wherein the interleaved memory is readable in a sequential access synchronous mode and in a random access asynchronous mode.

17. A circuit according to claim 15, further comprising an input pad for receiving the externally generated chip enable signal; and wherein said delay circuits are coupled to the input pad.

18. A circuit according to claim 15, wherein the second internal replica signal has a leading edge that is delayed with respect to a leading edge of the first internal replica signal.

19. A circuit according to claim 15, wherein a duration of the second internal replica signal is conditionally incremented to prevent non-synchronization between the externally generated address latch enabling signal and the externally generated chip enable signal when the interleaved memory is operating in a sequential access synchronous mode or in a random access asynchronous mode.

20. A circuit according to claim 15, wherein said at least one logic gate comprises a NOR logic gate.

21. A circuit according to claim 15, wherein said delay circuits provide a plurality of distinct paths for varying a delay of the delayed output signal.

22. A circuit according to claim 21, wherein the plurality of paths comprises three.

23. A method for regenerating an externally generated address latch enabling signal for an interleaved memory, the method comprising:
storing the externally generated address latch enabling signal in at least one latch for providing an output signal;
providing a first internal replica signal of the externally generated address latch enabling signal using at least one logic gate having inputs for receiving the output signal and an externally generated chip enable signal;
providing a delayed output signal using delay circuits coupled in cascade to an output of the at least one latch;
combining the first internal replica signal and the output signal with the delayed output signal using at least one logic circuit for producing set and reset signals; and
producing a second internal replica signal of the externally generated address latch enabling signal using an output flip-flop circuit having inputs for receiving the set and reset signals.

24. A method according to claim 23, wherein the interleaved memory is readable in a sequential access synchronous mode and in a random access asynchronous mode.

25. A method according to claim 23, further comprising receiving the externally generated chip enable signal at an input pad; and wherein said delay circuits are coupled to the input pad.

26. A method according to claim 23, further comprising delaying a leading edge of the second internal replica signal with respect to a leading edge of the first internal replica signal.

27. A method according to claim 23, wherein a duration of the second internal replica signal is conditionally incremented to prevent non-synchronization between the externally generated address latch enabling signal and the externally generated chip enable signal when the interleaved memory is operating in a sequential access synchronous mode or in a random access asynchronous mode.

28. A method according to claim 23, wherein the at least one logic gate comprises a NOR logic gate.

29. A method according to claim 23, wherein the delay circuits provide a plurality of distinct paths for varying a delay of the delayed output signal.

30. A method according to claim 29, wherein the plurality of paths comprises three.

* * * * *